United States Patent
Seko et al.

(10) Patent No.: US 6,584,279 B2
(45) Date of Patent: Jun. 24, 2003

(54) HEATER SEALED WITH CARBON WIRE HEATING ELEMENT

(75) Inventors: Sunao Seko, Oguni-machi (JP); Tomio Konn, Oguni-machi (JP); Tomohiro Nagata, Yamagata (JP); Norihiko Saito, Oguni-machi (JP); Hideyuki Yokoyama, Iide-machi (JP); Masakazu Kobayashi, Arakawa-machi (JP); Takanori Saito, Sagamihara (JP); Ken Nakao, Sagamihara (JP)

(73) Assignees: Toshiba Ceramics Co., Ltd., Tokyo (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/864,196

(22) Filed: May 25, 2001

(65) Prior Publication Data
US 2002/0001460 A1 Jan. 3, 2002

(30) Foreign Application Priority Data
May 25, 2000 (JP) .......................................... 2000-154101

(51) Int. Cl.⁷ ................................................... F26B 3/30
(52) U.S. Cl. ........................ 392/407; 392/497; 338/208; 219/444.1; 423/447.7
(58) Field of Search ............................... 392/407, 432, 392/435, 497, 418; 219/552, 443.1, 444.1, 523, 529, 545; 338/208; 432/5, 152; 423/447.3, 447.5, 447.7; 252/502, 506

(56) References Cited

U.S. PATENT DOCUMENTS

| | | | | |
|---|---|---|---|---|
| 4,816,289 A | * | 3/1989 | Komatsu et al. | 423/447.3 |
| 5,126,533 A | * | 6/1992 | Newman et al. | 219/444.1 |
| 5,297,956 A | * | 3/1994 | Yamabe et al. | 432/5 |
| 5,343,022 A | * | 8/1994 | Gilbert, Sr. et al. | 219/552 |
| 5,431,561 A | * | 7/1995 | Yamabe et al. | 432/152 |
| 5,881,208 A | * | 3/1999 | Geyling et al. | 392/418 |
| 5,904,872 A | * | 5/1999 | Arami et al. | 219/444.1 |
| 6,046,439 A | * | 4/2000 | Johnsgard et al. | 219/444.1 |
| 6,072,162 A | * | 6/2000 | Ito et al. | 219/444.1 |
| 6,198,074 B1 | * | 3/2001 | Savas | 219/444.1 |
| 6,204,488 B1 | * | 3/2001 | Toya et al. | 219/444.1 |
| 6,242,719 B1 | * | 6/2001 | Kano et al. | 219/444.1 |

OTHER PUBLICATIONS

Eiichi et al.; "Carbon Heater"; Patent Abstracts of Japan; Publication No. 2000–021890; Publication Date: Jan. 21, 2000; Abstract.

* cited by examiner

Primary Examiner—Teresa Walberg
Assistant Examiner—Fadi H. Dahbour
(74) Attorney, Agent, or Firm—Foley & Lardner

(57) ABSTRACT

A heater sealed with carbon wire heating element has a carbon wire heating element sealed with a quartz glass member, the carbon wire being prepared by knitting carbon single fibers into a knitted cord of a braid, each wire having a crystal structure with a interlayer spacing d (002) thereof being 0.343 or less and crystallite size Lc (002) thereof being 4.0 nm or more.

22 Claims, 3 Drawing Sheets

(a)

(b)

HEATER SEALED WITH CARBON WIRE HEATING ELEMENT

BACKGROUND OF THE INVENTION

1. Field of the Invention

The present invention relates to a heater sealed with a carbon wire heating element therein and more particularly to a heater sealed with a carbon wire heating element in which a carbon wire of carbon fibers having a particular crystal structure is sealed as a heating element, resulting in obtaining a heater sealed with a carbon wire heating element excellent in stable resistance when the current is flowing and particularly in anti-aging characteristic.

2. Description of the Related Art

Heaters using a carbon heating element therein have excellent properties in raising and lowering the temperature due to a small heat capacity as compared to heaters using a metal heating element, and offering a wide industrial application to various types of heating apparatus.

In the field of the semiconductor manufacturing, especially, silicon wafers are subjected to various heat treatments in the process thereof. Moreover, such heat treatments are in need of strict temperature control while it is essential to maintain a clean atmosphere for heat treatment in which no particles such as dust or the like are present. For this purpose, it is required to meet various conditions; that is, the heater used for the heat treatment must show an excellent uniformity in heating performance and the heater will not give off contaminating substances during the process.

In general, heaters having a structure in which carbon heating elements are sealed within support members of quartz glass material together with the atmosphere of a non-oxidizing gas are widely used as a heater for semiconductor manufacturing processes.

The inventors developed, in the past, a heater for semiconductor heat treatment apparatus and proposed the same in Japanese Patent Application H10-254513, in which fine carbon fibers are bound into a carbon bundle and a plurality of such bundles are woven into a carbon wire heating element to be filled in the quartz glass support member together with a non-oxidizing gas.

This type of carbon wire heating element not only shares the advantages required for the carbon heating element such as an excellent property to raise and lower the temperature and a high temperature resistance but also an extra advantage of having more flexibility than the heating elements made of solid carbon material because said carbon wire heating element is manufactured by binding a plurality of fine carbon single fibers into a bundle and weaving a plurality of such bundles to such an extent that various structures and configurations are easily realized.

Therefore, the heater having a clean and heat-resistant support member of high purity quartz glass support member in which this type of heating element is sealed together with a non-oxidizing gas is free from a risk of giving off particles and is most suitable to the semiconductor manufacturing heater.

It is to be noted here that the carbon wires used for the conventional heater of this type were manufactured by following a baking process to carbonize the fiber form precursor at a temperature in the neighborhood of about 1300° C. and that the quality of the product is maintained by improving the purity of materials to suppress the concentration of contained impurities thereof at a level of 10 ppm or less.

Recently, however, it was recently observed that said conventional carbon wires for the heating element were often used at a temperature higher than the prescribed temperature needed for firing and the disadvantage that the heater performance such as electric resistance thereof or the like becomes unstable has been pointed out.

More specifically,

① The crystal structure of carbon single fibers composing the carbon wire gradually changes under the heat to lower the carbon wire resistance ($\Omega$/m) gradually to such an extent that a change in the resistance of the whole heater due to aging takes place; and ② The chemicals adhered to the carbon wires are liberated by the heat in the form of a gas to change the inner pressure inside the quartz glass member filled with the carbon wires during the long service life thereof with the result that the performance of the heating element is affected.

It is not rare that such heater sealed with the carbon wire heating element as being put to the industrial use including said heater for the heat treatment of semiconductor wafers has an instantaneous temperature as high as 1800° C. when the current flows. Therefore, any solution of such problem has been much in demand.

SUMMARY OF THE INVENTION

The present invention is made to solve the problems present in the conventional carbon wire heating element and its object is to provide an excellent heater sealed with a carbon wire heating element which has a stable resistance when the current is flowing and particularly a stable resistance free from aging; that is, the heating performance of the heater will not change throughout a long service period.

Therefore, the present invention provides a heater sealed with carbon wire heating element comprising a heating element composed of carbon wires each being prepared by knitting carbon single fibers into a knitted cord or a braid, each carbon single fiber having a crystal structure with a interlayer spacing d (002) thereof being 0.343 or less and a crystallite size Lc (002) thereof being 4.0 nm or more; and a quartz glass member sealed with said heating element.

Further, the present invention also provide a heater sealed with carbon wire heating element, in a preferred mode of embodiment, characterized in that said heating element is prepared by binding a plurality of carbon single fibers into a bundle, each single fiber having a diameter of 5 through 15 $\mu$m and knitting a plurality of such bundles into a knitted cord or a braid.

Specifically, a heater sealed with carbon wire sealing element which is characterized in being prepared by binding 3000 through 6000 carbon single fibers into a bundle and knitting 6 through 12 such bundles into a knitted cord or a braid having a diameter of 1.5 through 3.0 mm is proposed.

Still further, the present invention provides a heater sealed with carbon wire sealing element which is characterized in that said carbon single fibers contain ash contents of 1 ppm or less.

Still further, the present invention provides a heater sealed with carbon wire sealing element which is characterized in that said heating element composed of carbon wire prepared by knitting carbon single fibers into a knitted cord or braid is subjected to a heat treatment at a temperature of 2000° C. or more in an inert gas atmosphere.

Still further, the present invention provides a heater sealed with carbon wire sealing element which is characterized in that said quartz glass member is provided with two terminals between which said carbon wire heating element is extended, at least one of said two terminals being provided with a mechanism to adjust a tension exerted on said carbon wire heating element.

The structural feature of the heater sealed with carbon wire sealing element according to the present invention is in that the heating element is composed of carbon wires each being prepared by knitting carbon single fibers into a knitted cord or a braid, each carbon single fiber having a crystal structure with a interlayer spacing d (002) thereof being 0.343 or less and a crystallite size Lc (002) thereof being 4.0 nm; and a quartz glass member sealed with said heating element.

Furthermore, said interlayer spacing d (002) and said crystallite size Lc (002) are measured using Gakushin-method for X-ray diffraction of carbon (Japan Society for the Promotion of Science, Committee 117, Carbon, 1963[36], 25).

The carbon wire heating element composed of carbon fibers having a special crystal structure is obtained by subjecting a carbon wire for the ordinary heating element to a heat treatment at a temperature of 2000° C. or more in an inert gas atmosphere.

The carbon wire heating element according to the present invention will not undergo any change in the crystal structure thereof in the temperature range (usually 2000° C.) at the time of the heater being in use; that is, no change in physical properties such as the electric resistance (Q/m) will take place because the graphitization will not proceed any longer.

Moreover, the growth of the crystal structure is uniform to make the quality of the product homogenized because the general carbon wire is heated uniformly and simultaneously.

Furthermore, most of the gaseous substances adhered to the carbon wire before the heat treatment are detached and removed.

Therefore, the heater sealed with said carbon wire heating element is found to have a high quality and an excellent anti-aging stability of electric resistance or the like while the current is flowing.

Although there is no perfect interpretation concerning why the carbon wire heating element is excellent in the anti-aging stability of electric resistance or the like, the following interpretation is presumed.

To be more specific, the carbonaceous substances having an intermediate structure between the amorphous carbon and the complete graphite crystal structure are in general called carbon materials, under the category of which petroleum cokes, carbon black and other carbon fibers fall.

It is known that said substances include graphitization-easy carbonaceous substances that easily proceed to grow until the graphite crystal structure by heat treatment and graphitization-resistant carbonaceous substances that will not be graphitized easily beyond a certain level where the graphitization stops. Carbon substances are known to belong said graphitization-resistant carbonaceous substances in view of the crystal structure thereof (interlayer spacing, accumulation thickness of the crystal faces) regardless of the starting materials (PAN, PVA, Pitch) thereof.

With general graphitization-easy carbonaceous substances (such as carbon black) other than the above carbon fibers, the graphitization process proceeds under the heat treatment through three graphitization stages including the first stage, the second stage and the third stage up to the final stage (usually at a temperature of 2400 through 3000° C.).

More specifically, the graphitization process enters the first stage with the interlayer spacing d (002) being 0.343 nm or less and with the crystallite size Lc (002) being 2.0 through 4.0 nm. Next, it enters the second stage where the interlayer spacing d (002) undergoes little change whereas the crystallite size Lc alone grows. Finally, the process reaches the third stage where the crystallite size Lc undergoes no change whereas the interlayer spacing rapidly decreases (to a degree of 0.336 nm).

However, while belonging to the graphitization-resistant carbonaceous material, the carbon wire composed of carbon fibers has a crystallite size Lc of at most 5.0 through 10.0 nm, unlike the process mentioned above, even if subjected to heat treatment at a temperature as high as 3000° C., said crystallite size being smaller than other type of graphitization-resistant carbonaceous material. In addition, the interlayer spacing d (002) is at most 0.339 nm. The graphitization thereof proceeds to develop the crystal texture from the first stage to the third stage, with the crystallite size Lc being stabilized without passing through the second stage where the crystallite size grows.

It is assumed that the carbon fibers subjected to the high temperature treatment shows such characteristic graphitization process because the micro texture of the carbon fibers is composed of a carbon chain structure in which a micro-crystallite portion and a non-crystallite portion are connected to each other in a continuous manner, the majority of said micro crystallite portion are arranged in a uniaxial direction to form a micro texture characteristic in the fibers intertwined each other.

Further, oxygen and other foreign substances contained in the carbon wire are gasified in the first stage of the heat treatment be discharged from the carbon wire.

Therefore, in the carbon wire sufficiently heat treated at a temperature of 2000° C. and preferably 2020° C. or more, the crystal structure of the carbon fiber composing the same proves to have the above specific structure. On the other hand, the graphitization will not fully proceed at a temperature less than 2000° C. with the result that it is difficult to properly adjust various physical properties including the resistance thereof ($\Omega$/m).

Further, the carbon fibers subjected to said graphitization have larger elongation under tension than prior to said treatment.

The carbon wire prepared by knitting carbon fibers into a knitted cord or a braid have carbon single fibers contacting each other at their peripheries such that the carbon wire becomes to have less electric resistance when tension is exerted thereon in the longitudinal direction thereof and less resistance fluctuation taken in the longitudinal direction because of increased contact area.

Therefore, the carbon wire of the present invention is preferably sealed in the quartz glass member in a taut condition (under tension).

DETAILED DESCRIPTION OF PREFERRED EMBODIMENTS

Figure 1:
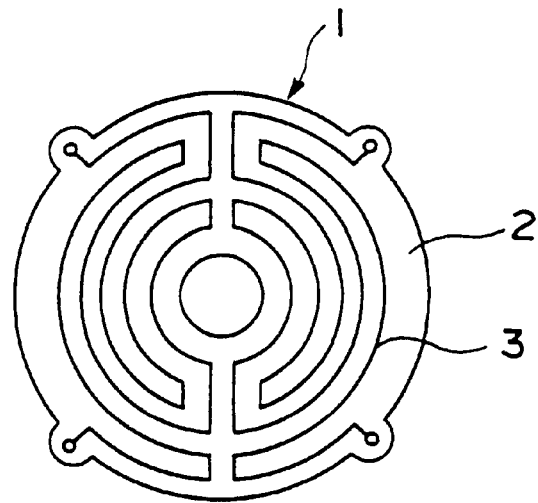
FIG. 1 (a) and FIG. 1 (b) show one example of the quartz glass support member of the heater sealed with the carbon wire heating elements according to the present invention, FIG. 1(a) being a plan view and FIG. 1(b) being a cross section thereof.
Figure 1:
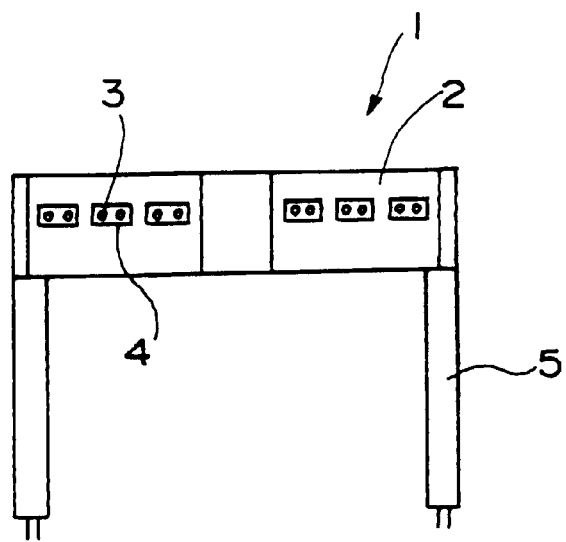

Hereinafter, the invention will be explained in detail.

The heater sealed with the carbon wire heating element of the present invention is characterized in that carbon wires made of carbon fibers having a special crystal structure are sealed in the crystal glass members in the form of heating elements.

The crystal structure of the carbon fibers composing said carbon wires of the present invention is characterized in that the interlayer spacing thereof is 0.343 nm or less while the size of the crystal Lc (002) is 4.0 nm or more.

As discussed in the foregoing, the carbon fibers having said crystalline structure will not proceed to carbonization even if subjected to an upper limit temperature of about 2000° C. Therefore, there is little change in the physical properties such as resistance ($\Omega$/m). Moreover, the elongation performance thereof is greater than that before the graphitization treatment.

More specifically, the carbon wire heating element having the particular crystal structure as mentioned above can be designed to have a longitudinal elongation performance of 1.0% or more. By means of this elongation performance of 1.0% or more, it is possible to fine adjust the resistance ($\Omega$/m) of said heating element such that a higher uniformity of the heater sealed with carbon wires according to the present invention. It is to be noted in this connection that said elongation performance now being discussed means the rate of elongation of the carbon wire heating element at the time when a carbon wire heating element having a predetermined length is fixedly supported at one end thereof while a tension of 0.1 Kg/mm$^2$ is exerted to the other end within a full range of elongation in which the carbon wire heating element will not snap. For example, when a tension of 0.1 Kg/mm$^2$ is exerted to a carbon wire heating element having a length of 1000 mm, the rate of elongation thereof is (1010−1000)/1000×100=1.0%.

The carbon fiber to be used for the carbon wire heating element of the present invention is preferably a carbon single fiber having a diameter of 5 to 15 $\mu$m though not limited thereto.

With carbon single fibers having a diameter of less than 5 $\mu$m, the toughness of each single fiber is so insufficient that it is difficult to manufacture a heating element by binding and knitting a plurality of single fibers into a demanded elongate form. Moreover, since each single fiber is too fine, the number of single fibers needed to acquire a predetermined number of resistance is too large to be put to a practical use. On the other hand, a single fiber having a diameter exceeding 15 $\mu$m lacks elasticity, making it difficult to knit binds of single fiber.

Furthermore, the ash contents contained in said carbon single fibers (Japan Industrial Standard JIS R 7223-1979) are preferred to be 1 ppm or less in view of the performance of the manufactured carbon wire heating element and the control of dust from said heating element.

In the present invention, the carbon wire is preferably prepared by binding, for example, 3000 through 6000 carbon single fibers each having a diameter of 5 to 15 $\mu$m into a bundle and weaving 6 to 12 such bundles into a carbon wire in the form of a knitted cord, a braid having a diameter of 1.5 to 3.0 mm. It is to be noted that with less than 3000 solid carbon single fibers being bound into bundles, 6 though 12 such fiber bundles are not sufficient for obtaining the required strength and resistance. If, however, an excessively large number of bundles are used in the preparation of a carbon wire, knitting is difficult. It is also rather difficult to obtain a preferable finish in shape because the knitted product can fray when broken in part.

If the number of fibers is more than 6000 on the other hand, the number of fiber bundles prepared by binding said single fibers is too small to obtain a predetermined resistance, making it difficult to maintain a required shape of the carbon wire prepared by knitting.

In order to manufacture a carbon wire heating element composed of carbon single fibers each having the particular crystal structure according to the present invention by use of the above mentioned carbon wires, said carbon wires (usually 100 m/lot) are fully subjected to heat treatment at a temperature of 2000° C. or more under the pressure of 0.1 Torr in the atmosphere of argon, helium or any other inert gases within a heat treatment reactor and preferably at a temperature of 2020° C. or more until the heat treated carbon single fibers proceed to graphitization the crystal structure as mentioned above.

The thus graphitized carbon wires are cut into pieces each having a length corresponding to the desired resistance and extended to play the role of heating elements in a predetermined support member of quartz glass. Then, terminals are connected thereto and sealed therein to be offered as a heater.

Furthermore, it is preferable that said heater sealed with a carbon wire heating element according to the present invention is provided therein with a pair of terminals connected to said quartz glass member, with the carbon wire heating element being extended between said terminals and it is also preferable that at least one of said terminals is provided with a tension adjusting mechanism for said carbon wire heating element. The provision thereof helps manufacture a heater which fully works as a carbon wire heating element of the present invention.

Said function to adjust such tension is preferably operable within a range of between nil and 0.1 kg/mm$^2$ in view of the elasticity toughness of said carbon wire heating element.

In this way, it is preferable to provide a tension adjusting mechanism composed of a screw to wind the carbon wire on at least one of the heater terminals such that said carbon wire heating element is maintained in a state of tension at a predetermined level.

In case where the quartz glass support member is, for example, disk-shaped and is formed with a groove (a space) arranged to receive insertion of the carbon wire heating elements, it is also acceptable that said carbon wire subject to graphitization treatment is mounted under a predetermined tension to be secured in that state such that a steady tension is exerted to said carbon wire.

For the quartz glass support member to be sealed with the carbon wire heating element of the invention, there is no particular requirement so long as a quartz glass support member having a shape which is normally used for a heater sealed with a carbon wire heating element of this type.

Figure 2:
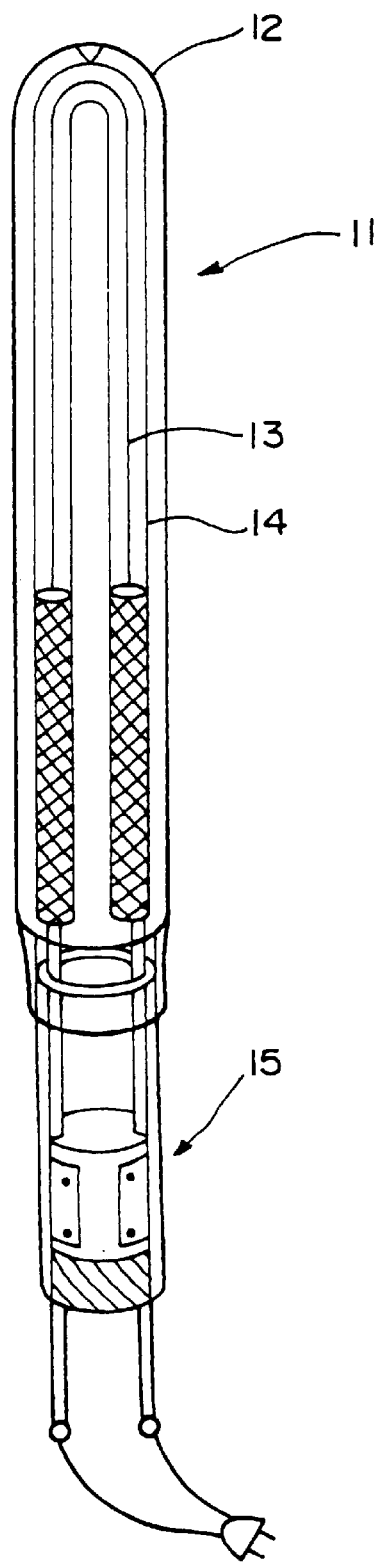
FIG. 2 shows, in perspective, another example of the quartz glass support member of the heater sealed with the carbon wire heating element according to the present invention.

Hereinafter, a suitable example of the quartz glass support member for the heater to be sealed with a carbon wire heating element will be shown in FIGS. 1(a) and 1(b) and FIG. 2. FIG. 1(a) is a plan view and FIG. 1(b) is a sectional view, both showing a disk-shaped support member for a plate-shaped heater. FIG. 2 is a perspective view of an annular support member for a rod-shaped heater.

The quartz glass support member 2 of said plate-shaped heater 1 shown in FIG. 1(a) has a heating face in the form of a circular disk and is formed with spaces 4 therein, said spaces 4 accommodating the carbon wire heating elements 3 arranged in so-called zigzag patterns. Other than said spaces 4, the structure of said quartz glass support member 2 is integrally fused together.

To the opposite ends of said carbon wire heating elements, sealing terminals 5 are connected while said spaces 4 are closed with an inert gas sealed therewithin.

Further, the rod-shaped heater 11 shown in FIG. 2 has a carbon wire heating element 13 is sealed in a small-diameter quartz glass tube 14 together with an inert gas, said small-diameter quartz glass tube 14 being accommodated within a large diameter quartz glass tube 12.

The opposite ends of said carbon wire heating element 13 are connected to the sealing terminal 15 which fusion seals an end of the large-diameter glass tube 12.

EXAMPLE

Then, carbon wires are prepared by binding 3000 pieces of various carbon single fibers (including one PAN-based carbon fiber and one pitch-based carbon fiber) each having a diameter of 7 μm into a bundle and knitting 9 such bundles into a knitted cord having a diameter of 2 mm. (each carbon wire having a length of 100 meters)

Among said carbon wires, those of each selected type are subjected to a graphitization process at a temperature of 2300° C. in an argon gas atmosphere (0.01 Torr) in a heat treatment reactor.

The thus graphitized various types of carbon single fibers and untreated such various types of carbon single fibers are selected to measure their interlayer spacing d (002) and crystallite size Lc (002) using Gakushin-method.

The result obtained is shown in Table 1.

Further, the graphitized PAN (polyacrylonitrile) type carbon wires and untreated counterparts are respectively subjected to measurement for respective electric resistances thereof (5 times for each type) The obtained result of the electric resistances ($\Omega$/m) and their fluctuations (highest values, lowest values and standard deviations) are depicted in Table 2.

It was observed from the results as shown in Table 1 and Table 2 that the graphitized carbon wires having a interlayer spacing d (002) of 0.343 nm or less and a crystallite size Lc of (002) of 4.0 nm or more according to the present invention have less electric resistances than the untreated carbon wires with the standard deviations being substantially reduced to show that uniformity of the carbon wires according to the present invention are realized.

TABLE 1

|  | Untreated | | Graphitized | |
| --- | --- | --- | --- | --- |
|  | d(002) (nm) | Lc (nm) | d(002) (nm) | Lc (nm) |
| PAN type | 0.3445 | 2.3 | 0.3426 | 5.1 |
| Pitch type | 0.3447 | 2.3 | 0.3427 | 4.5 |

TABLE 2

| | PAN Type | |
| --- | --- | --- |
|  | Untreated | Graphitized |
| Mean Resistance ($\Omega$/m) | 17.344 | 10.018 |
| Standard deviation ($\Omega$/m) | 0.058 | 0.026 |
| Highest value ($\Omega$/m) | 17.488 | 10.095 |
| Lowest value ($\Omega$/m) | 17.115 | 9.969 |

Said PAN type carbon wires used in the above embodiment was subjected to graphitization in the argon atmosphere (0.01 Torr) with the condition for heating temperature thereof alone being changed.

Figure 3:
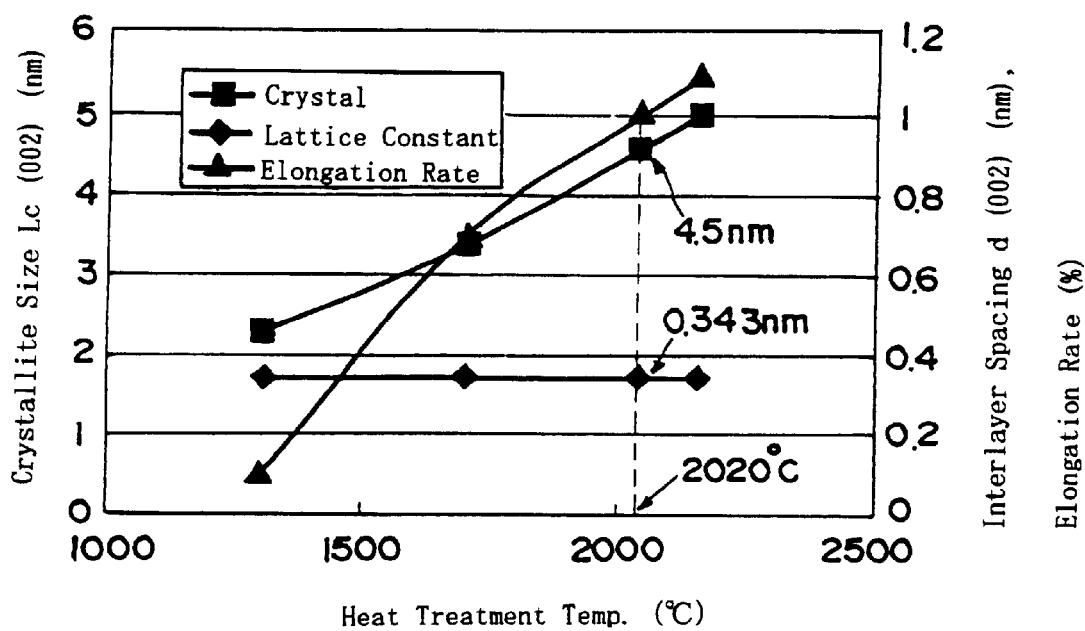
FIG. 3 is a graph showing the relationship between the heat treatment temperature, the size of the crystals and the interlayer spacing d thereof.

The crystallite size Lc (002) and interlayer spacing d (002) of the carbon wire at each temperature are measured while the rate of an elongation thereof was measured at the time when a tension of 0.04 Kg/mm$^2$ is exerted to each carbon wire having a diameter of 1000 mm (provided that the unit area thereof is an apparent cross section of the carbon wires). The results are shown in FIG. 3.

It was confirmed from said results that the rate of elongation was increased by 1% when the crystallite size Lc (002) is maintained at 0.343 nm or less while the interlayer spacing d is maintained at 4.5 nm or more.

In this way, it has become possible to easily adjust inter-lot fluctuations of the carbon wires because the range of adjustment increased for electric resistance of the carbon wire heating element as used in the heater.

The carbon wire sealed with heating element of the present invention employs a heating element formed of carbon wires prepared by binding carbon single fibers having a particular crystal structure into a bundle and knitting a plurality of such bundles into carbon wires have a stable resistance while the current is flowing and an anti-aging performance as compared to the conventional heater of this type.

Further, the use of the carbon wire having a particular crystal structure allows the rate of longitudinal elongation of the heating element to become 1.0% or more such that the resistance of the heating elements are fine adjusted.

What is claimed is:

1. A heater sealed with carbon wire heating element therein comprising a heating element composed of carbon wires each being prepared by knitting carbon fibers into a knitted cord or braid and then graphitized, each carbon single fiber having a crystal structure with an interlayer spacing d (002) thereof being 0.343 nm or less and a crystallite size Lc (002) thereof being 4.0 nm or more; and a quartz glass member sealed with said heating member therein.

2. A heater sealed with carbon wire heating element as set forth in claim 1, wherein a longitudinal elongation performance of said heating element is 1.0% or more.

3. A heater sealed with carbon wire heating element as set forth in claim 2, wherein said heating element is prepared by binding a plurality of carbon single fibers into a bundle, each single fiber having a diameter of 5 through 15 μm and knitting a plurality of such bundles into a knitted cord or a braid.

4. A heater sealed with carbon wire heating element as set forth in claim 2, wherein said carbon single fibers contain ash content of 1 ppm or less.

5. A heater sealed with carbon wire heating element as set forth in claim 2, wherein said heating element composed of carbon wire prepared by knitting carbon single fibers into a knitted cord or braid is subjected to a heat treatment at a temperature of 2000° C. or more in an inert gas atmosphere.

6. A heater sealed with carbon wire heating element as set forth in claim 2, wherein said quartz glass member is provided with two terminals between which said carbon wire heating element is extended, at least one of said two terminals being provided with a mechanism to adjust a tension exerted on said carbon wire heating element.

7. A heater sealed with carbon wire heating element as set forth in claim 1, wherein said heating element is prepared by binding a plurality of carbon single fibers into a bundle, each single fiber having a diameter of 5 through 15 μm and knitting a plurality of such bundles into a knitted cord or a braid.

8. A heater sealed with carbon wire heating element as set forth in claim 7, wherein said heating element is prepared by binding 3000 through 6000 carbon single fibers into a bundle and knitting 6 through 12 such bundles into a knitted cord or a braid having a diameter of 1.5 through 3.0 mm.

9. A heater sealed with carbon wire heating element as set forth in claim 8, wherein said carbon single fibers contain ash content of 1 ppm or less.

10. A heater sealed with carbon wire heating element as set forth in claim 8, wherein said heating element composed of carbon wire prepared by knitting carbon single fibers into a knitted cord or braid is subjected to a heat treatment at a temperature of 2000° C. or more in an inert gas atmosphere.

11. A heater sealed with carbon wire heating element as set forth in claim 8, wherein said quartz glass member is provided with two terminals between which said carbon wire heating element is extended, at least one of said two terminals being provided with a mechanism to adjust a tension exerted on said carbon wire heating element.

12. A heater sealed with carbon wire heating element as set forth in claim 7, wherein said carbon single fibers contain ash content of 1 ppm or less.

13. A heater sealed with carbon wire heating element as set forth in claim 7, wherein said heating element composed of carbon wire prepared by knitting carbon single fibers into a knitted cord or braid is subjected to a heat treatment at a temperature of 2000° C. or more in an inert gas atmosphere.

14. A heater sealed with carbon wire heating element as set forth in claim 7, wherein said quartz glass member is provided with two terminals between which said carbon wire heating element is extended, at least one of said two terminals being provided with a mechanism to adjust a tension exerted on said carbon wire heating element.

15. A heater sealed with carbon wire heating element as set forth in claim 1, wherein said carbon single fibers contain ash content of 1 ppm or less.

16. A heater sealed with carbon wire heating element as set forth in claim 15, wherein said heating element composed of carbon wire prepared by knitting carbon single fibers into a cord or braid is subjected to a heat treatment at a temperature of 2000° C. or more in an inert gas atmosphere.

17. A heater sealed with carbon wire heating element as set forth in claim 16, wherein said quartz glass member is provided with two terminals between which said carbon wire heating element is extended, at least one of said two terminals being provided with a mechanism to adjust a tension exerted on said carbon wire heating elements.

18. A heater sealed with carbon wire heating element as set forth in claim 15, wherein said quartz glass member is provided with two terminals between which said carbon wire heating elements is extended, at least one of said two terminals being provided with a mechanism to adjust a tension exerted on said carbon wire heating elements.

19. A heater sealed with carbon wire heating element as set forth in claim wherein said heating element composed of carbon wire prepared by knitting carbon single fibers into a knitted cord or braid is subjected to a heat treatment at a temperature of 2000° C. or more in an inert gas atmosphere.

20. A heater sealed with carbon wire heating element as set forth in claim 19, wherein said quartz glass member is provided with two terminals between which said carbon wire heating elements is extended, at least one of said two terminals being provided with a mechanism to adjust a tension exerted on said carbon wire heating elements.

21. A heater sealed with carbon wire heating element as set forth in claim 1, wherein said quartz glass member is provided with two terminals between which said carbon wire heating element is extended, at least one of said two terminals being provided with a mechanism to adjust a tension exerted on said carbon wire heating element.

22. A heater sealed with a carbon wire element comprising a carbon wire heating element sealed within a quartz glass member and produced by a process comprising:

(a) knitting carbon fibers into a knitted cord or braid, (b) graphitizing said cord or braid to produce a wire heating element, and (c) sealing said wire heating element within a quartz glass member, wherein a longitudinal elongation performance of said heating element is 1.0% or more.

\* \* \* \* \*

UNITED STATES PATENT AND TRADEMARK OFFICE
CERTIFICATE OF CORRECTION

PATENT NO.     : 6,584,279 B1
DATED          : June 24, 2003
INVENTOR(S)    : Sunao Seko It is certified that error appears in the above-identified patent and that said Letters Patent is hereby corrected as shown below:

<u>Title page,</u>
Item [*] Notice, should read -- [*] Notice: The term of this patent term adjustment is extednded Under 35 U.S.C. 154(b) 106 days. --

Signed and Sealed this

Twentieth Day of January, 2004

JON W. DUDAS
*Acting Director of the United States Patent and Trademark Office*